(12) United States Patent
Chang

(10) Patent No.: US 10,003,258 B2
(45) Date of Patent: Jun. 19, 2018

(54) CHARGE PUMP CIRCUIT WITH A LOW REVERSE CURRENT

(71) Applicant: eMemory Technology Inc., Hsin-Chu (TW)

(72) Inventor: Wu-Chang Chang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days. days.

(21) Appl. No.: 15/604,664

(22) Filed: May 25, 2017

(65) Prior Publication Data

US 2017/0346394 A1 Nov. 30, 2017

Related U.S. Application Data

(60) Provisional application No. 62/341,105, filed on May 25, 2016.

(51) Int. Cl.

| G05F 3/02 | (2006.01) |
|---|---|
| G05F 1/10 | (2006.01) |
| H02M 3/07 | (2006.01) |
| G11C 5/14 | (2006.01) |
| H03K 17/687 | (2006.01) |
| H03K 3/012 | (2006.01) |
| H03K 5/159 | (2006.01) |

(52) U.S. Cl.
CPC ............... *H02M 3/07* (2013.01); *G11C 5/145* (2013.01); *G11C 5/147* (2013.01); *H03K 3/012* (2013.01); *H03K 17/687* (2013.01); *H02M 2003/075* (2013.01); *H03K 5/159* (2013.01)

(58) Field of Classification Search
CPC .. H02M 3/073; H02M 3/07; H02M 2003/077; G11C 5/145; G05F 3/205
USPC .......................................................... 327/536
See application file for complete search history.

(56) References Cited

U.S. PATENT DOCUMENTS

| 5,126,590 | A | * | 6/1992 | Chern | ..................... | H02M 3/07 327/536 |
|---|---|---|---|---|---|---|
| 6,501,325 | B1 | * | 12/2002 | Meng | ..................... | H02M 3/073 327/536 |
| 7,078,956 | B1 | | 7/2006 | Kim | | |
| 7,679,430 | B2 | | 3/2010 | Fort | | |
| 2002/0122324 | A1 | * | 9/2002 | Kim | ..................... | H02M 3/073 363/59 |
| 2008/0116958 | A1 | * | 5/2008 | Ko | ......................... | H02M 3/073 327/536 |
| 2013/0207716 | A1 | * | 8/2013 | Lee | ........................... | G05F 3/02 327/536 |

(Continued)

*Primary Examiner* — Quan Tra
(74) *Attorney, Agent, or Firm* — Winston Hsu

(57) ABSTRACT

A charge pump circuit includes a first charge pump unit and a second charge pump unit. The first charge pump unit pumps an input voltage to output a first pumped voltage according to a first clock signal, a second clock signal and a third clock signal. The second charge pump unit pumps the first pumped voltage to output a second pumped voltage according to the first clock signal, a fourth clock signal and the third clock signal. The first clock signal and the third clock signal are non-overlapping clock signals. A falling edge of the second clock signal leads a rising edge of the first clock signal. A falling edge of the fourth clock signal leads a rising edge of the third clock signal.

20 Claims, 5 Drawing Sheets

(56) References Cited

U.S. PATENT DOCUMENTS

2016/0118879 A1* 4/2016 De Cicco .............. H02M 3/073
327/536

* cited by examiner

CHARGE PUMP CIRCUIT WITH A LOW REVERSE CURRENT

CROSS REFERENCE TO RELATED APPLICATIONS

This non-provisional application claims priority of U.S. provisional application No. 62/341,105, filed on May 25, 2016, included herein by reference in its entirety.

BACKGROUND OF THE INVENTION

1. Field of the Invention

This invention is related to a charge pump circuit, especially to a charge pump with a low reverse current.

2. Description of the Prior Art

Due to requirements of low power for electronic devices, the power specification of integrated circuits (IC) is redesigned to work in a low voltage environment for reducing power consumption. For example, the IC power specification that used to be 5V before is now reduced to 3.3V or even lower than 2V. Although lower voltages are supplied to reduce power consumption, greater voltages are still needed in some situations. For example, flash memory may require a greater voltage for programming or erasing. The greater voltage is usually supplied by a charge pump circuit.

The charge pump circuits of prior art are usually controlled by different clock signals. However, since the clock signals are not perfect square waves, switches of the charge pump circuits may be turned on or turned off unpredictably during transitions of voltage levels of the clock signals. In this case, unwanted reverse currents may be produced, which further increases power consumption.

SUMMARY OF THE INVENTION

One embodiment of the present disclosure discloses a charge pump circuit. The charge pump circuit includes a first charge pump unit and a second charge pump unit.

The first charge pump unit receives an input voltage, a first clock signal, a second clock signal and a third clock signal, and pumps the input voltage to output a first pumped voltage according to the first clock signal, the second clock signal and the third clock signal. The second charge pump unit is coupled to the first charge pump unit. The second charge pump unit receives the first clock signal, a fourth clock signal and the third clock signal. The second charge pump unit pumps the first pumped voltage to output a second pumped voltage according to the first clock signal, the fourth clock signal and the third clock signal.

The first clock signal and the third clock signal are non-overlapping clock signals. A falling edge of the second clock signal leads a rising edge of the first clock signal. A rising edge of the second clock signal following the falling edge of the second clock signal leads a falling edge of the first clock signal following the rising edge of the first clock signal. A falling edge of the fourth clock signal leads a rising edge of the third clock signal. A rising edge of the fourth clock signal following the falling edge of the fourth clock signal leads a falling edge of the third clock signal following the rising edge of the third clock signal.

Another embodiment of the present disclosure discloses a charge pump circuit. The charge pump circuit includes a voltage input port, a voltage output port, and M charge pump units.

An ith charge pump unit of the M charge pump units includes an input terminal, an output terminal, a first N-type transistor, a second N-type transistor, a third N-type transistor, a first P-type transistor, a second P-type transistor, a first capacitor, a second capacitor, and a third capacitor.

The first N-type transistor of the ith charge pump unit has a first terminal coupled to the input terminal of the ith charge pump unit, a second terminal, and a control terminal. The second N-type transistor of the ith charge pump unit has a first terminal coupled to the input terminal of the ith charge pump unit, a second terminal coupled to the control terminal of the first N-type transistor of the ith charge pump unit, and a control terminal coupled to the second terminal of the first N-type transistor of the ith charge pump unit. The third N-type transistor of the ith charge pump unit has a first terminal coupled to the input terminal of the ith charge pump unit, a second terminal coupled to the second terminal of the first N-type transistor of the ith charge pump unit, and a control terminal coupled to the first terminal of the third N-type transistor of the ith charge pump unit.

The first capacitor of the ith charge pump unit has a first terminal configured to receive a first clock signal, and a second terminal coupled to the second terminal of the first N-type transistor of the ith charge pump unit. The first P-type transistor of the ith charge pump unit has a first terminal coupled to the second terminal of the first N-type transistor of the ith charge pump unit, a second terminal coupled to the output terminal of the ith charge pump unit, a control terminal, and a body terminal coupled to the second terminal of the first P-type transistor of the ith charge pump unit. The second P-type transistor of the ith charge pump unit has a first terminal coupled to the control terminal of the first P-type transistor of the ith charge pump unit, a second terminal coupled to the output terminal of the ith charge pump unit, a control terminal coupled to the first terminal of the first P-type transistor of the ith charge pump unit, and a body terminal coupled to the second terminal of the second P-type transistor of the ith charge pump unit.

The second capacitor of the ith charge pump unit has a first terminal configured to receive a second clock signal, and a second terminal coupled to the control terminal of the first P-type transistor of the ith charge pump unit. The third capacitor of the ith charge pump unit has a first terminal configured to receive a third clock signal, and a second terminal coupled to the control terminal of the first N-type transistor of the ith charge pump unit.

An (i+1)th charge pump unit of the M charge pump units includes an input terminal, an output terminal, a first N-type transistor, a second N-type transistor, a third N-type transistor, a first P-type transistor, a second P-type transistor, a first capacitor, a second capacitor, and a third capacitor.

The first N-type transistor of the (i+1)th charge pump unit has a first terminal coupled to the input terminal of the (i+1)th charge pump unit, a second terminal, and a control terminal. The second N-type transistor of the (i+1)th charge pump unit has a first terminal coupled to the input terminal of the (i+1)th charge pump unit, a second terminal coupled to the control terminal of the first N-type transistor of the (i+1)th charge pump unit, and a control terminal coupled to the second terminal of the first N-type transistor of the (i+1)th charge pump unit. The third N-type transistor of the (i+1)th charge pump unit has a first terminal coupled to the input terminal of the (i+1)th charge pump unit, a second terminal coupled to the second terminal of the first N-type transistor of the (i+1)th charge pump unit, and a control terminal coupled to the first terminal of the third N-type transistor of the (i+1)th charge pump unit.

The first capacitor of the (i+1)th charge pump unit has a first terminal configured to receive the third clock signal, and a second terminal coupled to the second terminal of the first N-type transistor of the (i+1)th charge pump unit.

The first P-type transistor of the (i+1)th charge pump unit has a first terminal coupled to the second terminal of the first N-type transistor of the (i+1)th charge pump unit, a second terminal coupled to the output terminal of the (i+1)th charge pump unit, a control terminal, and a body terminal coupled to the second terminal of the first P-type transistor of the (i+1)th charge pump unit. The second P-type transistor of the (i+1)th charge pump unit has a first terminal coupled to the control terminal of the first P-type transistor of the (i+1)th charge pump unit, a second terminal coupled to the output terminal of the (i+1)th charge pump unit, a control terminal coupled to the first terminal of the first P-type transistor of the (i+1)th charge pump unit, and a body terminal coupled to the second terminal of the second P-type transistor of the (i+1)th charge pump unit.

The second capacitor of the (i+1)th charge pump unit has a first terminal configured to receive a fourth clock signal, and a second terminal coupled to the control terminal of the first P-type transistor of the (i+1)th charge pump unit. The third capacitor of the (i+1)th charge pump unit has a first terminal configured to receive the first clock signal, and a second terminal coupled to the control terminal of the first N-type transistor of the (i+1)th charge pump unit.

M is a positive integer greater than 1, and i is a positive integer smaller than M. The first clock signal and the third clock signal are non-overlapping clock signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
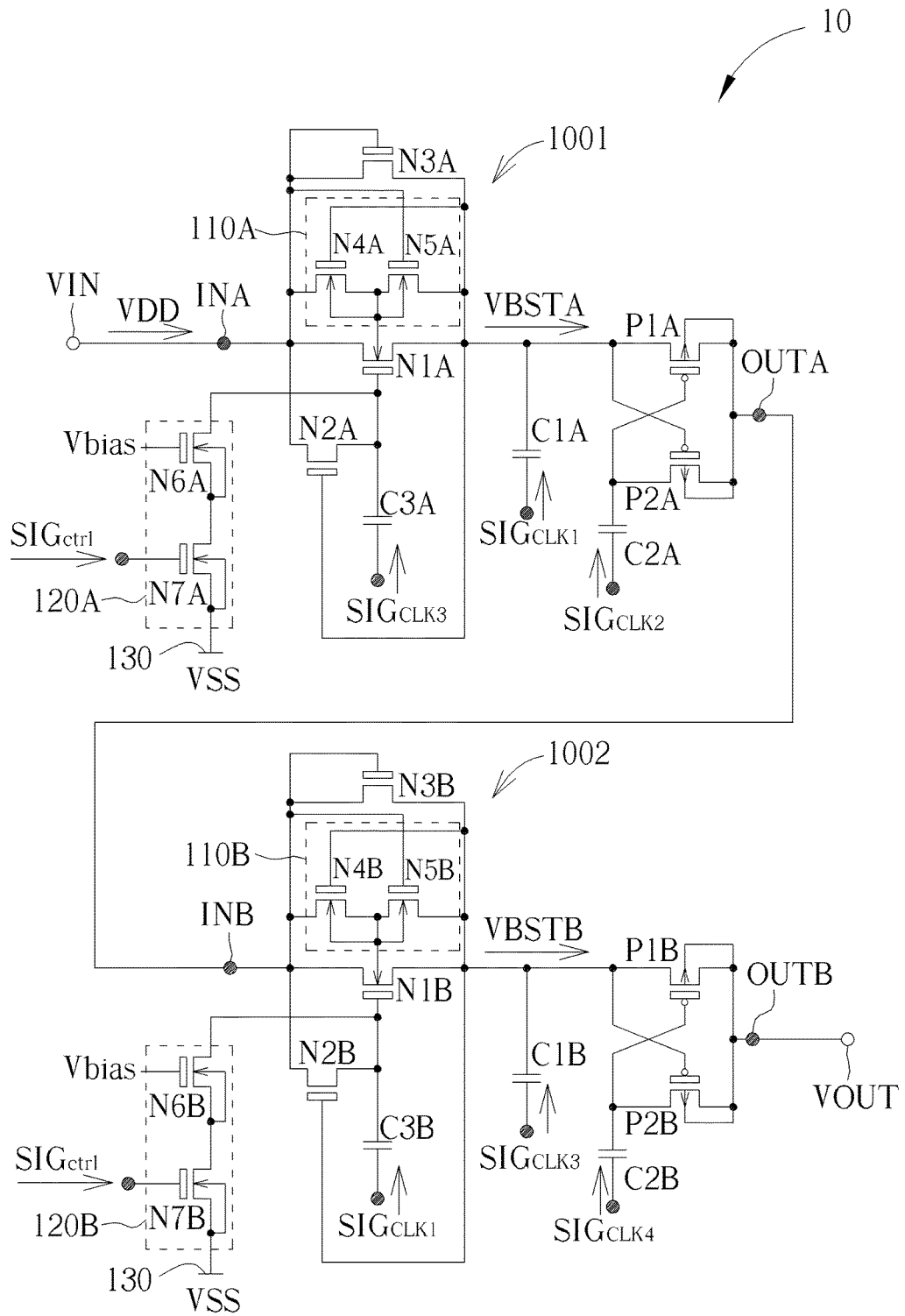
FIG. 1 shows a charge pump circuit according to one embodiment of the present disclosure.

FIG. 1 shows a charge pump circuit 10 according to one embodiment of the present disclosure. The charge pump circuit 10 includes a voltage input port VIN, a voltage output port VOUT, a first charge pump unit 1001, and a second charge pump unit 1002. The two charge pump units 1001 and 1002 may have the same structure but may receive different signals.

The first charge pump unit 1001 includes an input terminal INA, an output terminal OUTA, a first N-type transistor N1A, a second N-type transistor N2A, a third N-type transistor N3A, a first P-type transistor P1A, a second P-type transistor P2A, a first capacitor C1A, a second capacitor C2A, and a third capacitor C3A.

The input terminal INA is coupled to the voltage input port VIN for receiving a first voltage VDD as its input voltage. The first N-type transistor N1A has a first terminal, a second terminal, and a control terminal. The first terminal of the first N-type transistor N1A is coupled to the input terminal INA. The second N-type transistor N2A has a first terminal, a second terminal, and a control terminal. The first terminal of the second N-type transistor N2A is coupled to the input terminal INA, the second terminal of the second N-type transistor N2A is coupled to the control terminal of the first N-type transistor N1A, and the control terminal of the second N-type transistor N2A is coupled to the second terminal of the first N-type transistor N1A.

The third N-type transistor N3A has a first terminal, a second terminal, and a control terminal. The first terminal of the third N-type transistor N3A is coupled to the input terminal INA, the second terminal of the third N-type transistor N3A is coupled to the second terminal of the first N-type transistor N1A, and the control terminal of the third N-type transistor N3A is coupled to the first terminal of the third N-type transistor N3A. In addition, the body terminal of the third N-type transistor N3A can be, but not limited to, coupled to the body terminal of the first N-type transistor N1A.

The first P-type transistor P1A has a first terminal, a second terminal, a control terminal, and a body terminal. The first terminal of the first P-type transistor P1A is coupled to the second terminal of the first N-type transistor N1A, the second terminal of the first P-type transistor P1A is coupled to the output terminal OUTA, the body terminal of the first P-type transistor P1A is coupled to the second terminal of the first P-type transistor P1A.

The second P-type transistor P2A has a first terminal, a second terminal, a control terminal, and a body terminal. The first terminal of the second P-type transistor P2A is coupled to the control terminal of the first P-type transistor P1A, the second terminal of the second P-type transistor P2A is coupled to the output terminal OUTA, the control terminal of the second P-type transistor P2A is coupled to the first terminal of the first P-type transistor P1A, and the body terminal of the second P-type transistor P2A is coupled to the second terminal of the second P-type transistor P2A.

The first capacitor C1A has a first terminal and a second terminal. The first terminal of the first capacitor C1A receives a first clock signal $SIG_{CLK1}$, and the second terminal of the first capacitor C1A is coupled to the second terminal of the first N-type transistor N1A. The second capacitor C2A has a first terminal and a second terminal. The first terminal of the second capacitor C2A receives a second clock signal $SIG_{CLK2}$, and the second terminal of the second capacitor C2A is coupled to the control terminal of the first P-type transistor P1A. The third capacitor C3A has a first terminal and a second terminal. The first terminal of the third capacitor C3A receives a third clock signal $SIG_{CLK3}$, and the second terminal of the third capacitor C3A is coupled to the control terminal of the first N-type transistor N1A.

The charge pump unit 1002 may have the same structure as the first charge pump unit 1001. That is, the second charge pump unit 1002 includes an input terminal INB, an output terminal OUTB, a first N-type transistor N1B, a second N-type transistor N2B, a third N-type transistor N3B, a first P-type transistor P1B, a second P-type transistor P2B, a first capacitor C1B, a second capacitor C2B, and a third capacitor C3B. The input terminal INB of the second charge pump unit 1002 is coupled to the output terminal OUTA of the first charge pump unit 1001. Furthermore, the first terminal of the first capacitor C1B receives the third clock signal $SIG_{CLK3}$, the first terminal of the second capacitor C2B receives a fourth clock signal $SIG_{CLK4}$, and the first terminal of the third capacitor C3B receives the first clock signal $SIG_{CLK1}$. In addition, the body terminal of the third N-type transistor N3B can be, but not limited to, coupled to the body terminal of the first N-type transistor N1B.

Figure 2:
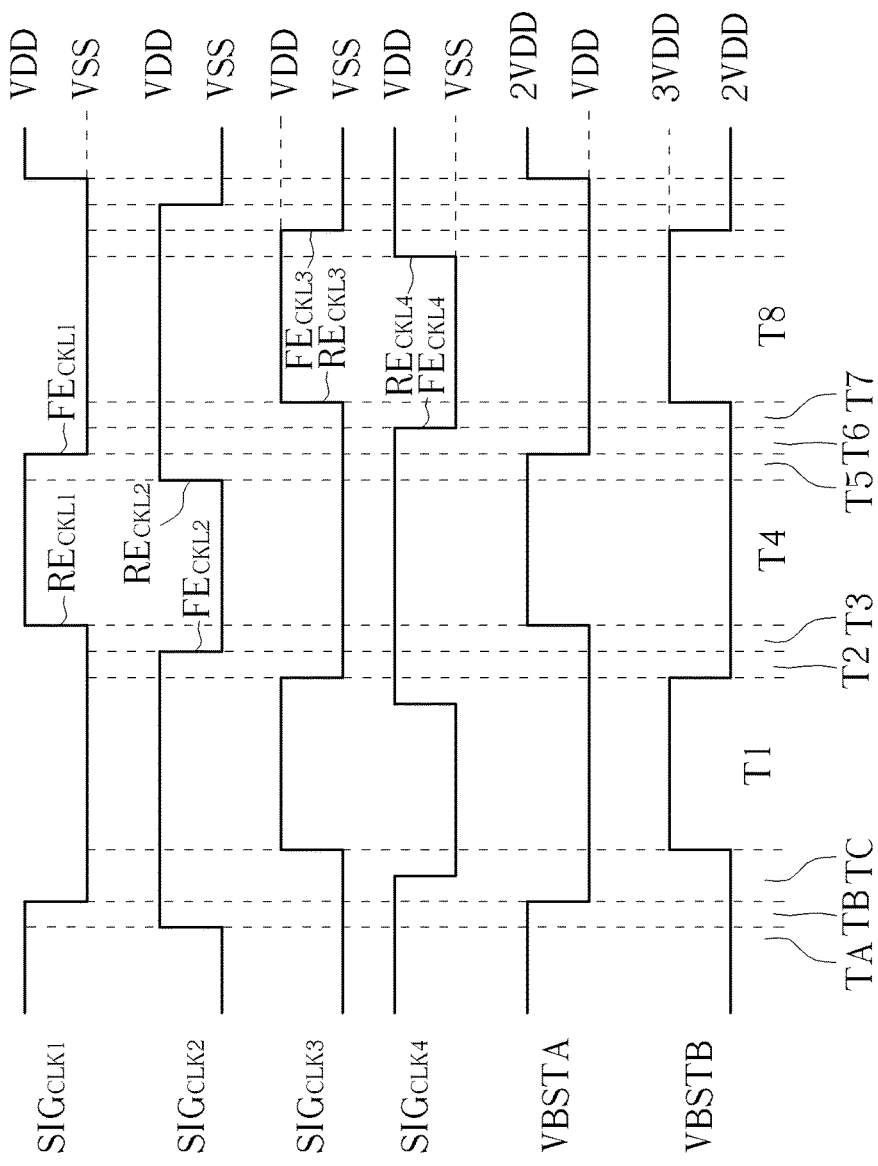
FIG. 2 shows the waveforms of the clock signals and the voltage at the second terminal of the first capacitors in the charge pump circuit in FIG. 1.

FIG. 2 shows the waveforms of the first clock signal $SIG_{CLK1}$, the second clock signal $SIG_{CLK2}$, the third clock signal $SIG_{CLK3}$, the fourth clock signal $SIG_{CLK4}$, the voltage VBSTA at the second terminal of the first capacitor C1A, and the voltage VBSTB at the second terminal of the first capacitor C1B according to one embodiment.

In FIG. 2, the first clock signal $SIG_{CLK1}$ and the third clock signal $SIG_{CLK3}$ are non-overlapping clock signals, that is, the first clock signal $SIG_{CLK1}$ and the third clock signal $SIG_{CLK3}$ transit at different time points. In more detail, when the first clock signal $SIG_{CLK1}$ is at a first voltage VDD, the third clock signal $SIG_{CLK3}$ would be at a second voltage VSS lower than the first voltage VDD. Also, when the third clock signal $SIG_{CLK3}$ is at the first voltage VDD, the first clock signal $SIG_{CLK1}$ would be at the second voltage VSS.

Furthermore, the falling edge $FE_{CLK2}$ of the second clock signal $SIG_{CLK2}$ leads the rising edge $RE_{CLK2}$ of the first clock signal $SIG_{CLK1}$, and the rising edge $RE_{CLK2}$ of the second clock signal $SIG_{CLK2}$ following the falling edge $FE_{CLK2}$ of the second clock signal $SIG_{CLK2}$ leads the falling edge $FE_{CLK1}$ of the first clock signal $SIG_{CLK1}$ following the rising edge $RE_{CLK1}$ of the first clock signal $SIG_{CLK1}$.

Also, the falling edge $FE_{CLK4}$ of the fourth clock signal $SIG_{CLK4}$ leads a rising edge $RE_{CLK3}$ of the third clock signal $SIG_{CLK3}$, and the rising edge $RE_{CLK4}$ of the fourth clock signal $SIG_{CLK4}$ following the falling edge $FE_{CLK4}$ of the fourth clock signal $SIG_{CLK4}$ leads a falling edge $FE_{CLK3}$ of the third clock signal $SIG_{CLK3}$ following the rising edge $RE_{CLK3}$ of the third clock signal $SIG_{CLK3}$.

The waveforms presented in FIG. 2 are captured when the charge pump circuit 10 has entered a stable state for outputting the pumped voltage consistently. However, in the beginning of the operation of the first charge pump unit 1001, the third N-type transistor N3A may charge the second terminal of the first capacitor C1A to a voltage level equal to VDD−Vthn, Vthn is the threshold voltage of the third N-type transistor N3A, when the first clock signal $SIG_{CLK1}$ is at the second voltage VSS, so the first charge pump unit 1001 can enter a stable state sooner for the rest of operations.

From period TA to period TC, a brief explanation of the behavior of the charge pump unit 1001 is provided for better understanding for the behavior of the charge pump units 1001 and 1002 from period T1 to period T8.

In period TA, the first clock signal $SIG_{CLK1}$ is at the first voltage VDD, the second clock signal $SIG_{CLK2}$ is at the second voltage VSS, and the third clock signal $SIG_{CLK3}$ is at the second voltage VSS. Since the second terminal of the first capacitor C1A was charged to the first voltage VDD when the first clock signal $SIG_{CLK1}$ was at the second voltage VSS, the second terminal of the first capacitor C1A is boosted to a third voltage 2VDD when the first clock signal $SIG_{CLK1}$ raises to the first voltage VDD. Therefore, the second N-type transistor N2A would be turned on, and the second terminal of the third capacitor C3A would be charged to the first voltage VDD through the second N-type transistor N2A in period TA.

In period TB, the second clock signal $SIG_{CLK2}$ changes to the first voltage VDD, and the first clock signal $SIG_{CLK1}$ changes to the second voltage VSS in period TC. Therefore, in periods TB and TC, the first P-type transistor P1A is turned off and then the second P-type transistor P2A is turned on, and the charge pump unit 1001 may stop sharing the stored charges with the charge pump unit 1002.

In period T1, the third clock signal $SIG_{CLK3}$ changes to the first voltage VDD, the first clock signal $SIG_{CLK1}$ is at the second voltage VSS, and the second clock signal $SIG_{CLK2}$ is at the first voltage VDD. Since the second terminal of the third capacitor C3A has been charged to the first voltage VDD when the third clock signal $SIG_{CLK3}$ was at the second voltage VSS in period TA, the second terminal of the third capacitor C3A would be boosted to the third voltage 2VDD that is two times the first voltage VDD when the third clock signal $SIG_{CLK3}$ changes from the second voltage VSS to the first voltage VDD.

Consequently, the first N-type transistor N1A is turned on, and the second terminal of the first capacitor C1A is charged to the first voltage VDD while the first terminal of the first capacitor C1A follows the first clock signal $SIG_{CLK1}$ to be at the second voltage VSS. In this case, the second P-type transistor P2A can be turned on and the second terminal of the second capacitor C2A can also be at the third voltage 2VDD, turning off the first P-type transistor P1A. That is, in period T1, the charge pump unit 1001 is charging the first capacitor C1A, and may not share the stored charges with the charge pump unit 1002.

In period T2, the third clock signal $SIG_{CLK3}$ changes to the second voltage VSS while the first clock signal $SIG_{CLK1}$, the second clock signal $SIG_{CLK2}$, and the fourth clock signal $SIG_{CLK4}$ remain unchanged. Therefore, the first N-type transistor N1A is turned off. The voltage VBSTA remains at the first voltage VDD since no discharging path is presented.

In period T3, the second clock signal $SIG_{CLK2}$ changes to the second voltage VSS while the first clock signal $SIG_{CLK1}$, the third clock signal $SIG_{CLK3}$, and the fourth clock signal $SIG_{CLK4}$ remain at the same status as the previous period. In period T4, the first clock signal $SIG_{CLK1}$ is at the first voltage VDD while the second clock signal $SIG_{CLK2}$, the third clock signal $SIG_{CLK3}$, and the fourth clock signal $SIG_{CLK4}$ remain at the same status as the previous period. That is, the first P-type transistor P1A can be turned on in the period T3 before the voltage VBSTA is boosted to the third voltage 2VDD according to the voltage raise of the first clock signal $SIG_{CLK1}$ in period T4. Therefore, the output terminal OUTA of the first charge pump unit 1001 will output the third voltage 2VDD through the first P-type transistor P1A in period T4.

Meanwhile, in period T4, the first N-type transistor N1B of the second charge pump unit 1002 will be turned on as the first clock signal $SIG_{CLK1}$ raises, so the voltage VBSTB of the second terminal of the first capacitor C1B will be charged by the first charge pump unit 1001 to be at the third voltage 2VDD. However, the gate delay for turning on the first P-type transistor P1A may reduce the charge sharing time between the first charge pump unit 1001 and the second charge pump unit 1002, and decrease the efficiency. Therefore, the first P-type transistor P1A of the first charge pump unit 1001 can be turned on in period T3 before period T4 to ensure the first capacitor C1B of the second charge pump unit 1002 can be charged instantly when the first clock signal $SIG_{CLK1}$ changes to the first voltage VDD.

However, in some embodiments, the second clock signal $SIG_{CLK2}$ may change from the first voltage VDD to the second voltage VSS when the first clock signal $SIG_{CLK1}$ changes from the second voltage VSS to the first voltage VDD if the gate delay is rather small.

Furthermore, when the voltage VBSTA of the second terminal of the first capacitor C1A is at the third voltage 2VDD, the second N-type transistor N2A can be turned on, keeping voltage of the second terminal of the third capacitor C3A to be the first voltage VDD. Therefore, the first N-type transistor N1A can be turned off, preventing the reverse current flowing from the second terminal of the first capacitor C1A to the input terminal INA.

In period T5, the second clock signal $SIG_{CLK2}$ is changed to the first voltage VDD while the first clock signal $SIG_{CLK1}$, the third clock signal $SIG_{CLK3}$, and the fourth clock signal $SIG_{CLK4}$ remain at the same status as the previous period. In period T6, the first clock signal $SIG_{CLK1}$ is changed to the second voltage VSS while the second clock signal $SIG_{CLK2}$, the third clock signal $SIG_{CLK3}$, and the fourth clock signal $SIG_{CLK4}$ remain at the same status as the previous period.

That is, the first P-type transistor P1A can be turned off in period T5 before the voltage VBSTA of the second terminal of the first capacitor C1A of the first charge pump unit 1001 drops when the first clock signal $SIG_{CLK1}$ drops in period T6. Therefore, the second terminal of the first capacitor C1B of the second charge pump unit 1002 will not receive the first voltage VDD from the first charge pump unit 1001 due to the delay time for turning off the first P-type transistor P1A and the first N-type transistor N1B, avoiding the reverse current. Furthermore, the second P-type transistor P2A is turned on in period T6, the second terminal and the control terminal of the first P-type transistor P1A is therefore electrically shorted, and at that time the first P-type transistor P1A behaves as an electrically diode-connected transistor to ensure no reverse current flowing through the first P-type transistor P1A.

In period T7, the fourth clock signal $SIG_{CLK4}$ is changed to the second voltage VSS while the first clock signal $SIG_{CLK1}$, the second clock signal $SIG_{CLK2}$, and the third clock signal $SIG_{CLK3}$ remain at the same status as the previous period. In period T8, the third clock signal $SIG_{CLK3}$ is changed to the first voltage VDD while the first clock signal $SIG_{CLK1}$, the second clock signal $SIG_{CLK2}$, and the fourth clock signal $SIG_{CLK4}$ remain at the same status as the previous period.

That is, the first P-type transistor P1B can be turned on in period T7 before the voltage VBSTB is boosted from the third voltage 2VDD to a fourth voltage 3VDD corresponding to the voltage raise of the third clock signal $SIG_{CLK3}$ in period T8. Therefore, the output terminal OUTB of the second charge pump unit 1002 will output the fourth voltage 3VDD through the first P-type transistor P1B in period T8 without being affected by the gate delay of the first P-type transistor P1B.

In summary, the main function of a charge pump circuit is to deliver a voltage higher than an input voltage received in the voltage input port through the voltage output port. The charge pump circuit of the present invention executes the operations of charge boosting and charge sharing during the longer periods (i.e., TA, T1, T4 and T8) while it turns on or off the charge sharing path properly during the other short periods (i.e., TB, TC, T2, T3, T5, T6 an T7) to prevent the reverse current.

Therefore, the two-stage charge pump circuit 10 can generate the fourth voltage 3VDD with the first voltage VDD. Also, with the four clock signals $SIG_{CLK1}$, $SIG_{CLK2}$, $SIG_{CLK3}$, and $SIG_{CLK4}$, the reverse current can be avoided.

According to the aforementioned operations, since the second capacitor C2A and the third capacitor C3A are mainly used to control the gate of the transistors, the second capacitor C2A and the third capacitor C3A may have to endure high voltage but need only small capacitance. Therefore, in some embodiments, the second capacitor C2A and the third capacitor C3A can be metal-oxide-metal (MOM) capacitors, for enduring the high operation voltage without requiring much area.

However, since the charges stored in the first capacitor C1A will be shared by the next stage of charge pump unit, the capacitance of the first capacitor C1A should be large enough to sustain the output voltage. In this case, the first capacitor C1A may be implemented by MOSFET capacitors for reducing the area.

In addition, in FIG. 1, the first charge pump unit 1001 further includes a body switch 110A and a discharge circuit 120A. The body switch 110A can ensure the voltage of the body terminal of the first N-type transistor N1A to be at a rather low voltage for reducing the body effect and the leakage current. The discharge circuit 120A can be used to discharge the second terminal of the third capacitor C3A when the charge pump unit 1001 stops outputting voltage, improving the reliability of the charge pump unit 1001.

Similarly, the second charge pump unit 1002 may also include a body switch 110B and a discharge circuit 120B.

In FIG. 1, the body switch 110A includes a fourth N-type transistor N4A and a fifth N-type transistor N5A. The fourth N-type transistor N4A has a first terminal, a second terminal, a control terminal, and a body terminal. The first terminal of the fourth N-type transistor N4A is coupled to the first terminal of the first N-type transistor N1A, the second terminal of the fourth N-type transistor N4A is coupled to the body terminal of the first N-type transistor N1A, the control terminal of the fourth N-type transistor N4A is coupled to the second terminal of the first N-type transistor N1A, and the body terminal of the fourth N-type transistor N4A is coupled to the body terminal of the first N-type transistor N1A.

The fifth N-type transistor N5A has a first terminal, a second terminal, a control terminal, and a body terminal. The first terminal of the fifth N-type transistor N5A is coupled to the body terminal of the first N-type transistor N1A, the second terminal of the fifth N-type transistor N5A is coupled to the second terminal of the first N-type transistor N1A, the control terminal of the fifth N-type transistor N5A is coupled to the first terminal of the first N-type transistor N1A, and the body terminal of the fifth N-type transistor N5A is coupled to the body terminal of the first N-type transistor N1A.

With the body switch 110A, the voltage of the body terminal of the first N-type transistor N1A can be controlled to be no greater than the voltages of the first terminal and the second terminals of the first N-type transistor N1A. Therefore, the body effect and the leakage current caused on the body terminal of the first N-type transistor N1A can be reduced.

The discharge circuit 120A is coupled between the control terminal of the first N-type transistor N1A and the system voltage terminal 130 for receiving a system voltage VSS.

In FIG. 1, the discharge circuit 120A includes a sixth N-type transistor N6A and a seventh N-type transistor N7A.

The sixth N-type transistor N6A has a first terminal, a second terminal, a control terminal, and a body terminal. The first terminal of the sixth N-type transistor N6A is coupled to the control terminal of the first N-type transistor N1A, the control terminal of the sixth N-type transistor N6A receives a bias voltage Vbias, and the body terminal of the sixth N-type transistor N6A is coupled to the second terminal of the sixth N-type transistor N6A.

The seventh N-type transistor N7A has a first terminal, a second terminal, a control terminal, and a body terminal. The first terminal of the seventh N-type transistor N7A is coupled to the second terminal of the sixth N-type transistor N6A, the second terminal of the seventh N-type transistor N7A is coupled to the system voltage terminal 130, a control terminal of the seventh N-type transistor N7A receives a control signal $SIG_{ctrl}$, and the body of the seventh N-type transistor N7A terminal is coupled to the second terminal of the seventh N-type transistor N7A.

The bias voltage Vbias and the control signal $SIG_{ctrl}$ can turn on the sixth N-type transistor N6A and the seventh N-type transistor N7A when the charge pump unit stops generating output voltage. However, the voltage of the second terminal of the third capacitor C3A can be rather high, such as the third voltage 2VDD. Furthermore, the voltage to be discharged can be even higher for the charge pump unit 1002. Therefore, the sixth N-type transistor N6A can be an N-type laterally diffused metal oxide semiconductor (LDMOS) for enduring the high voltage in some embodiments. In this case, the seventh N-type transistor N7A can be a normal low voltage metal oxide semiconductor for not increasing the area unnecessarily. However, the discharge circuit may include different numbers of transistors and/or different types of transistors according to the system requirement.

Figure 3:
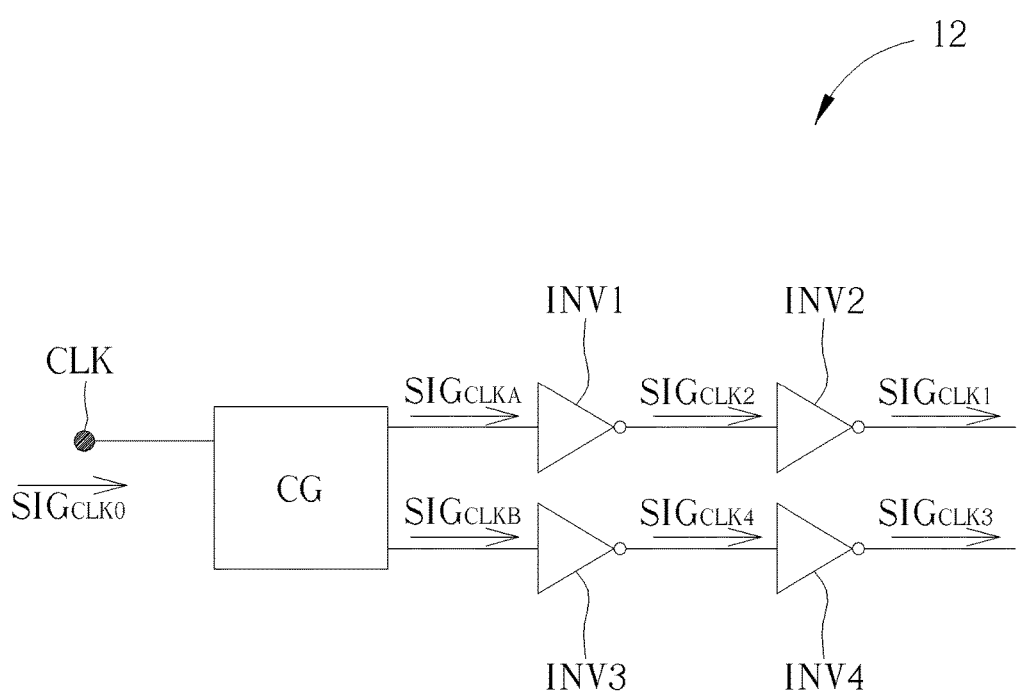
FIG. 3 shows a clock generation circuit according to one embodiment of the present disclosure.

In some embodiments, the charge pump unit 10 may further include a clock generation circuit 12 for generating the required clock signals. FIG. 3 shows the clock generation circuit 12 according to one embodiment of the present disclosure.

The clock generation circuit 12, includes a clock input terminal CLK, a non-overlapping clock generator CG, a first inverter INV1, a second inverter INV2, a third inverter INV3, and a fourth inverter INV4.

The clock input terminal CLK receives a main clock signal $SIG_{CLK0}$. The main clock signal $SIG_{CLK0}$ can be generated by a clock source of the application system in some embodiments. The non-overlapping clock generator CG is coupled to the clock input terminal CLK, and can produce a first intermediate clock signal $SIG_{CLKA}$ and a second intermediate clock signal $SIG_{CLKB}$. The non-overlapping clock generator CG can be implemented by any non-overlapping clock generators known or unknown by the field with the first intermediate clock signal $SIG_{CLKA}$ and the second intermediate clock signal $SIG_{CLKB}$ being non-overlapping.

The first inverter INV1 has an input terminal and an output terminal. The input terminal of the first inverter INV1 receives the first intermediate clock signal $SIG_{CLKA}$, and the output terminal of the first inverter INV1 outputs the second clock signal $SIG_{CLK2}$.

The second inverter INV2 has an input terminal and an output terminal. The input terminal of the second inverter INV2 is coupled to the output terminal of the first inverter INV1, and the output terminal of the second inverter INV2 outputs the first clock signal $SIG_{CLK1}$.

The third inverter INV3 has an input terminal and an output terminal. The input terminal of the third inverter INV3 receives the second intermediate clock signal $SIG_{CLKB}$, and the output terminal of the third inverter INV3 outputs the fourth clock signal $SIG_{CLK4}$.

The fourth inverter INV4 has an input terminal and an output terminal. The input terminal of the fourth inverter INV4 is coupled to the output terminal of the third inverter INV3, and the output terminal of the fourth inverter INV4 outputs the third clock signal $SIG_{CLK3}$.

With the clock generation circuit 12, the four clock signals $SIG_{CLK1}$, $SIG_{CLK2}$, $SIG_{CLK3}$, and $SIG_{CLK4}$ required by the charge pump circuit 10 can be generated easily to avoid the reverse current and increase the efficiency of the charge pump circuit 10.

Figure 4:
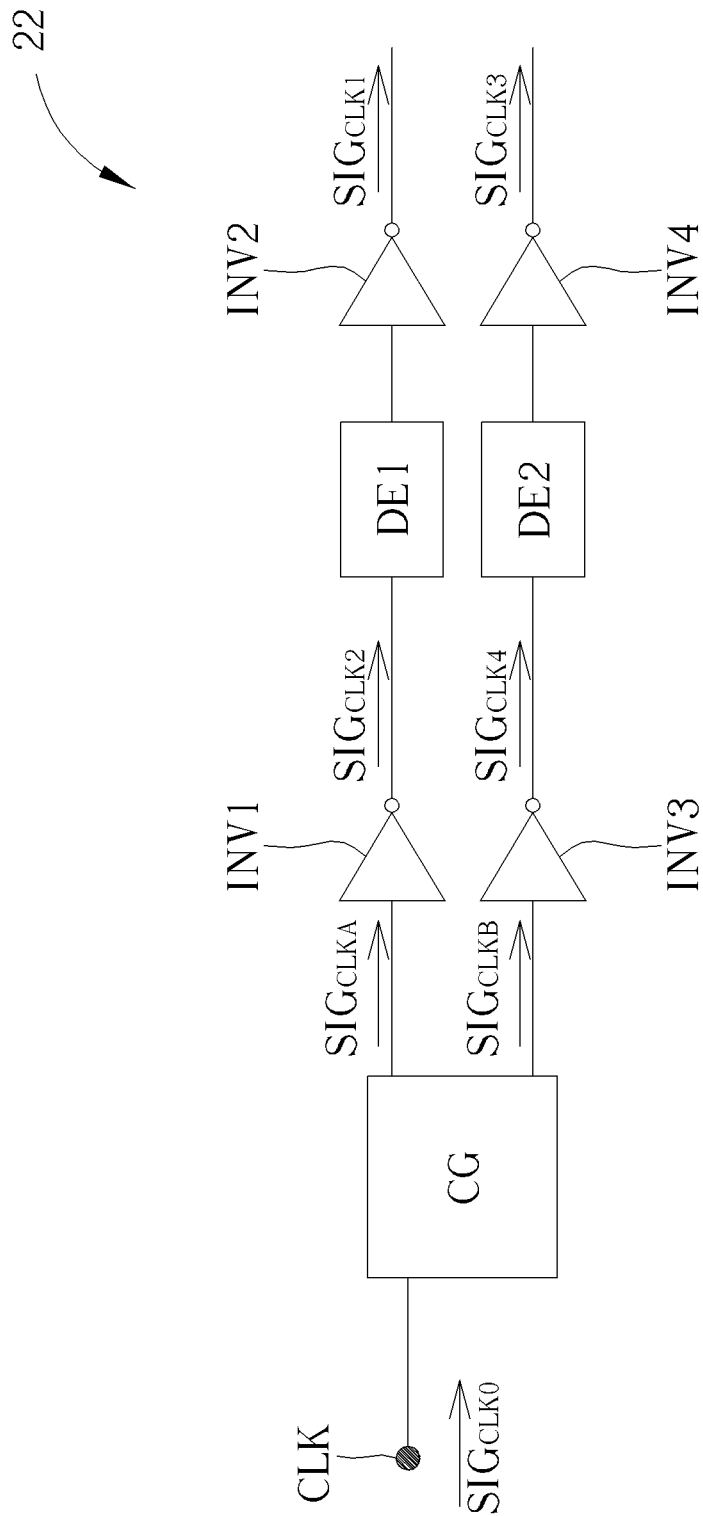
FIG. 4 shows a clock generation circuit according to another embodiment of the present disclosure.

FIG. 4 shows a clock generation circuit 22 according to another embodiment of the present disclosure. The clock generation circuit 22 has the similar structure as the clock generation circuit 12. However, the clock generation circuit 22 further includes two delay circuits DE1 and DE2.

The first delay circuit DE1 has an input terminal and a second terminal. The input terminal of the first delay circuit DE1 is coupled to the output terminal of the first inverter INV1. The second inverter INV2 has an input terminal and an output terminal. The input terminal of the second inverter INV2 is coupled to the output terminal of the first delay circuit DE1, and the output terminal of the second inverter INV2 outputs the first clock signal $SIG_{CLK1}$.

The second delay circuit DE2 has an input terminal and a second terminal. The input terminal of the second delay circuit DE2 is coupled to the output terminal of the third inverter INV3. The fourth inverter INV4 has an input terminal and an output terminal. The input terminal of the fourth inverter INV4 is coupled to the output terminal of the second delay circuit DE2, and the output terminal of the fourth inverter INV4 outputs the third clock signal $SIG_{CLK3}$.

That is, the first delay circuit DE1 can be added between the first inverter INV1 and the second inverter INV2 to create a proper delay between the first clock signal $SIG_{CLK1}$ and the second clock signal $SIG_{CLK2}$ according to the system requirement. Similarly, the second delay circuit DE2 can be added between the third inverter INV3 and the fourth inverter INV4 to create a proper delay between the third clock signal $SIG_{CLK3}$ and the fourth clock signal $SIG_{CLK4}$.

Although the charge pump circuit 10 includes two stages of charge pump units 1001 and 1002, the charge pump circuit of the present disclosure may include more stages of charge pump units for outputting even higher voltage.

Figure 5:
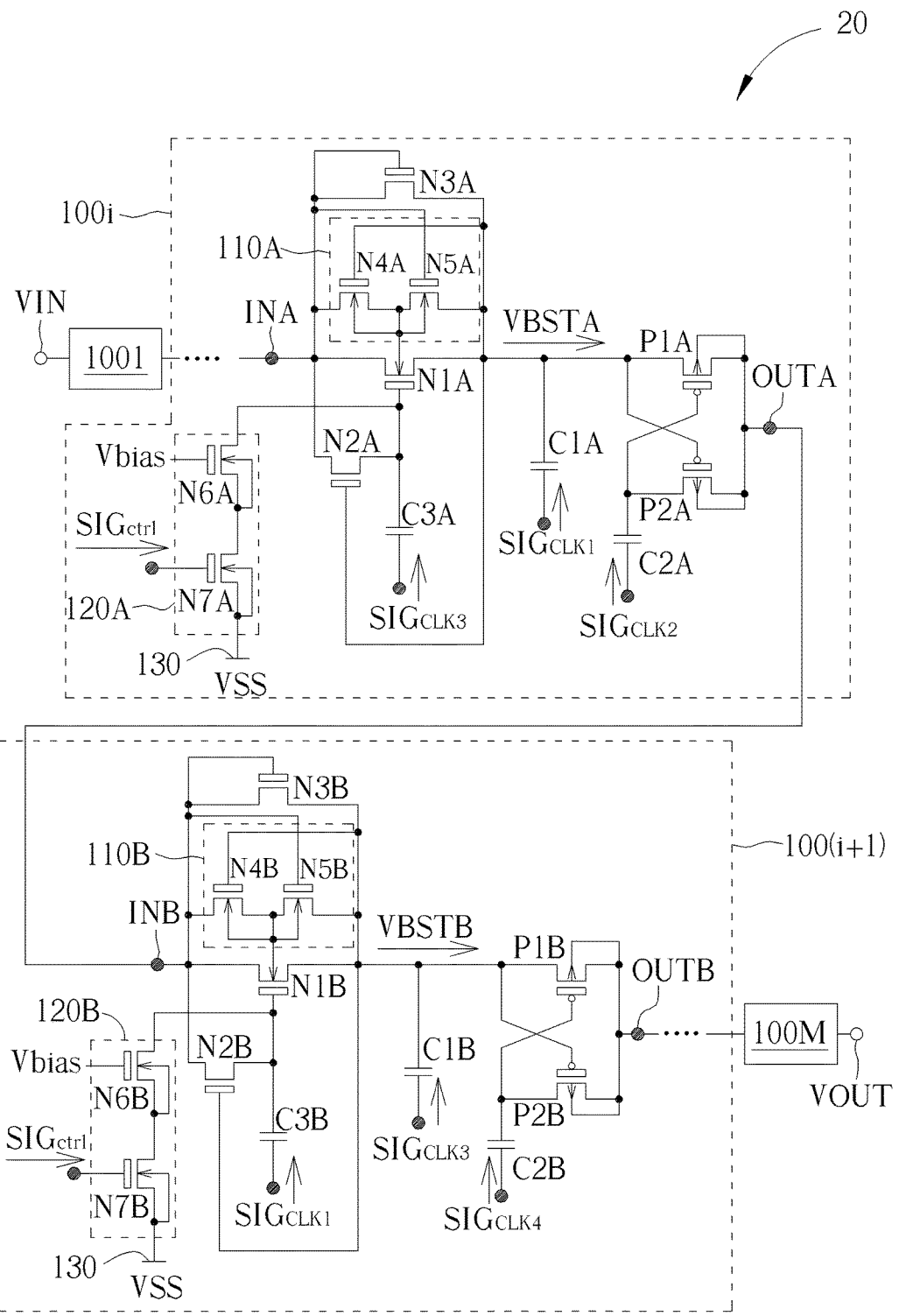
FIG. 5 shows a charge pump circuit according to another embodiment of the present disclosure.

FIG. 5 shows a charge pump circuit 20 according to another embodiment of the present disclosure. The charge pump circuit 20 includes M charge pump units 1001 to 100M, wherein M is a positive integer greater than 1. With the voltage input port VIN receiving the first voltage VDD, the charge pump circuit 20 is able to output a fifth voltage (M+1)VDD, which is (M+1) times the first voltage VDD. The charge pump units 1001 to 100M may all have the same structure; however, each two successive charge pump units may receive different sets of clock signals.

For example, in FIG. 5, the first terminal of the first capacitor C1A of the ith charge pump unit 100$i$ receives the first clock signal $SIG_{CLK1}$, the first terminal of the second capacitor C2A of the ith charge pump unit 100$i$ receives the second clock signal $SIG_{CLK2}$, and the first terminal of the third capacitor C3A of the ith charge pump unit 100$i$ receives the third clock signal $SIG_{CLK3}$, wherein i is a positive integer smaller than M.

In this case, the first terminal of the first capacitor C1B of the (i+1)th charge pump unit 100(i+1) receives the third clock signal $SIG_{CLK3}$, the first terminal of the second capacitor C2B of the (i+1)th charge pump unit 100(i+1) receives the fourth clock signal $SIG_{CLK4}$, and the first terminal of the third capacitor C3B of the (i+1)th charge pump unit 100(i+1) receives the first clock signal $SIG_{CLK1}$.

That is, the second terminals of the first capacitors in the two successive charge pump units can be charged at different periods and can be boosted at different periods, allowing the charge stored in the prior charge pump unit can be shared with the later charge pump unit stably. Also, with the four clock signals $SIG_{CLK1}$, $SIG_{CLK2}$, $SIG_{CLK3}$, and $SIG_{CLK4}$, the charge pump circuit 20 is able to generate the output voltage (M+1)VDD while reducing the reverse current and increasing the power efficiency. The charge pump circuit 20 may adopt the clock generation circuit 12 in FIG. 3 or the clock generation circuit 22 in FIG. 4 for generating the required clock signals.

In summary, the charge pump circuits provided by the embodiments of the present disclosure are able to output pumped voltages with four clock signals. With the well-designed four clock signals, each two successive charge pump units can be charged at different periods and can be boosted at different periods, allowing the charge stored in the prior charge pump unit can be shared with the later charge pump unit stably. By turning off the first P-type transistor before stop outputting the pumped voltage, the reverse current caused by the gate delay of the first P-type transistor can be avoided. Also, by turning on the first P-type transistor before outputting the pumped voltage, the inefficiency caused by the gate delay of the first P-type transistor can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump circuit comprising:
   a first charge pump unit configured to receive an input voltage, a first clock signal, a second clock signal and a third clock signal and pump the input voltage to output a first pumped voltage according to the first clock signal, the second clock signal and the third clock signal; and
   a second charge pump unit coupled to the first charge pump unit, and configured to receive the first pumped voltage, the first clock signal, a fourth clock signal and the third clock signal and pump the first pumped voltage to output a second pumped voltage according to the first clock signal, the fourth clock signal and the third clock signal;
   wherein:
   the first clock signal and the third clock signal are non-overlapping clock signals;
   a falling edge of the second clock signal leads a rising edge of the first clock signal;
   a rising edge of the second clock signal following the falling edge of the second clock signal leads a falling edge of the first clock signal following the rising edge of the first clock signal;
   a falling edge of the fourth clock signal leads a rising edge of the third clock signal; and
   a rising edge of the fourth clock signal following the falling edge of the fourth clock signal leads a falling edge of the third clock signal following the rising edge of the third clock signal.

2. The charge pump circuit of claim 1, wherein the first charge pump unit comprising:
   an input terminal configured to receive the input voltage;
   an output terminal configured to output the first pumped voltage;
   a first N-type transistor having a first terminal coupled to the input terminal, a second terminal, and a control terminal;
   a second N-type transistor having a first terminal coupled to the input terminal, a second terminal coupled to the control terminal of the first N-type transistor, and a control terminal coupled to the second terminal of the first N-type transistor;
   a third N-type transistor having a first terminal coupled to the input terminal, a second terminal coupled to the second terminal of the first N-type transistor, and a control terminal coupled to the first terminal of the third N-type transistor;
   a first capacitor having a first terminal configured to receive the first clock signal, and a second terminal coupled to the second terminal of the first N-type transistor;
   a first P-type transistor having a first terminal coupled to the second terminal of the first N-type transistor, a second terminal coupled to the output terminal, a control terminal, and a body terminal coupled to the second terminal of the first P-type transistor;
   a second P-type transistor having a first terminal coupled to the control terminal of the first P-type transistor, a second terminal coupled to the output terminal, a control terminal coupled to the first terminal of the first P-type transistor, and a body terminal coupled to the second terminal of the second P-type transistor;
   a second capacitor having a first terminal configured to receive the second clock signal, and a second terminal coupled to the control terminal of the first P-type transistor; and
   a third capacitor having a first terminal configured to receive the third clock signal, and a second terminal coupled to the control terminal of the first N-type transistor.

3. The charge pump circuit of claim 2, wherein the first charge pump unit further comprises:
   a fourth N-type transistor having a first terminal coupled to the first terminal of the first N-type transistor, a second terminal coupled to a body terminal of the first N-type transistor, a control terminal coupled to the second terminal of the first N-type transistor, and a body terminal coupled to the body terminal of the first N-type transistor; and
   a fifth N-type transistor having a first terminal coupled to the body terminal of the first N-type transistor, a second terminal coupled to the second terminal of the first N-type transistor, a control terminal coupled to the first terminal of the first N-type transistor, and a body terminal coupled to the body terminal of the first N-type transistor.

4. The charge pump circuit of claim 2, wherein the first charge pump unit further comprises a discharge circuit coupled between the control terminal of the first N-type transistor and a system voltage terminal for receiving a system voltage.

5. The charge pump circuit of claim 4, wherein the discharge circuit comprises:
   a sixth N-type transistor having a first terminal coupled to the control terminal of the first N-type transistor, a second terminal, and a control terminal configured to receive a bias voltage; and
   a seventh N-type transistor having a first terminal coupled to the second terminal of the sixth N-type transistor, a second terminal coupled to the system voltage terminal, a control terminal configured to receive a control signal, and a body terminal coupled to the second terminal of the seventh N-type transistor.

6. The charge pump circuit of claim 5, wherein the sixth N-type transistor is an N-type laterally diffused metal oxide semiconductor (LDMOS).

7. The charge pump circuit of claim 2, wherein the second capacitor and the third capacitor are metal-oxide-metal (MOM) capacitors.

8. A charge pump circuit comprising:
a voltage input port;
a voltage output port;
M charge pump units comprising:
- an ith charge pump unit comprising:
  - an input terminal;
  - an output terminal;
  - a first N-type transistor having a first terminal coupled to the input terminal of the ith charge pump unit, a second terminal, and a control terminal;
  - a second N-type transistor having a first terminal coupled to the input terminal of the ith charge pump unit, a second terminal coupled to the control terminal of the first N-type transistor of the ith charge pump unit, and a control terminal coupled to the second terminal of the first N-type transistor of the ith charge pump unit;
  - a third N-type transistor having a first terminal coupled to the input terminal of the ith charge pump unit, a second terminal coupled to the second terminal of the first N-type transistor of the ith charge pump unit, and a control terminal coupled to the first terminal of the third N-type transistor of the ith charge pump unit;
  - a first capacitor having a first terminal configured to receive a first clock signal, and a second terminal coupled to the second terminal of the first N-type transistor of the ith charge pump unit;
  - a first P-type transistor having a first terminal coupled to the second terminal of the first N-type transistor of the ith charge pump unit, a second terminal coupled to the output terminal of the ith charge pump unit, a control terminal, and a body terminal coupled to the second terminal of the first P-type transistor of the ith charge pump unit;
  - a second P-type transistor having a first terminal coupled to the control terminal of the first P-type transistor of the ith charge pump unit, a second terminal coupled to the output terminal of the ith charge pump unit, a control terminal coupled to the first terminal of the first P-type transistor of the ith charge pump unit, and a body terminal coupled to the second terminal of the second P-type transistor of the ith charge pump unit;
  - a second capacitor having a first terminal configured to receive a second clock signal, and a second terminal coupled to the control terminal of the first P-type transistor of the ith charge pump unit; and
  - a third capacitor having a first terminal configured to receive a third clock signal, and a second terminal coupled to the control terminal of the first N-type transistor of the ith charge pump unit; and
- an (i+1)th charge pump unit comprising:
  - an input terminal coupled to the output terminal of the ith charge pump unit;
  - an output terminal;
  - a first N-type transistor having a first terminal coupled to the input terminal of the (i+1)th charge pump unit, a second terminal, and a control terminal;
  - a second N-type transistor having a first terminal coupled to the input terminal of the (i+1)th charge pump unit, a second terminal coupled to the control terminal of the first N-type transistor of the (i+1)th charge pump unit, and a control terminal coupled to the second terminal of the first N-type transistor of the (i+1)th charge pump unit;
  - a third N-type transistor having a first terminal coupled to the input terminal of the (i+1)th charge pump unit, a second terminal coupled to the second terminal of the first N-type transistor of the (i+1)th charge pump unit, and a control terminal coupled to the first terminal of the third N-type transistor of the (i+1)th charge pump unit;
  - a first capacitor having a first terminal configured to receive the third clock signal, and a second terminal coupled to the second terminal of the first N-type transistor of the (i+1)th charge pump unit;
  - a first P-type transistor having a first terminal coupled to the second terminal of the first N-type transistor of the (i+1)th charge pump unit, a second terminal coupled to the output terminal of the (i+1)th charge pump unit, a control terminal, and a body terminal coupled to the second terminal of the first P-type transistor of the (i+1)th charge pump unit;
  - a second P-type transistor having a first terminal coupled to the control terminal of the first P-type transistor of the (i+1)th charge pump unit, a second terminal coupled to the output terminal of the (i+1)th charge pump unit, a control terminal coupled to the first terminal of the first P-type transistor of the (i+1)th charge pump unit, and a body terminal coupled to the second terminal of the second P-type transistor of the (i+1)th charge pump unit;
  - a second capacitor having a first terminal configured to receive a fourth clock signal, and a second terminal coupled to the control terminal of the first P-type transistor of the (i+1)th charge pump unit; and
  - a third capacitor having a first terminal configured to receive the first clock signal, and a second terminal coupled to the control terminal of the first N-type transistor of the (i+1)th charge pump unit;

wherein:
M is a positive integer greater than 1;
i is a positive integer smaller than M; and
the first clock signal and the third clock signal are non-overlapping clock signals.

9. The charge pump circuit of claim 8, wherein:
a falling edge of the second clock signal leads a rising edge of the first clock signal;
a rising edge of the second clock signal following the falling edge of the second clock signal leads a falling edge of the first clock signal following the rising edge of the first clock signal;
a falling edge of the fourth clock signal leads a rising edge of the third clock signal; and
a rising edge of the fourth clock signal following the falling edge of the fourth clock signal leads a falling edge of the third clock signal following the rising edge of the third clock signal.

10. The charge pump circuit of claim 9, further comprising a clock generation circuit comprising:
a clock input terminal configured to receive a main clock signal;
a non-overlapping clock generator coupled to the clock input terminal, and configured to produce a first intermediate clock signal and a second intermediate clock signal, the first intermediate clock signal and the second intermediate clock signal are non-overlapping clock signals;
a first inverter having an input terminal configured to receive the first intermediate clock signal, and an output terminal for outputting the second clock signal;
a second inverter having an input terminal coupled to the output terminal of the first inverter, and an output terminal for outputting the first clock signal;
a third inverter having an input terminal configured to receive the second intermediate clock signal, and an output terminal for outputting the fourth clock signal; and
a fourth inverter having an input terminal coupled to the output terminal of the third inverter, and an output terminal for outputting the third clock signal.

11. The charge pump circuit of claim 9, further comprising a clock generation circuit comprising:
a clock input terminal configured to receive a main clock signal;
a non-overlapping clock generator coupled to the clock input terminal, and configured to produce a first intermediate clock signal and a second intermediate clock signal, the first intermediate clock signal and the second intermediate clock signal are non-overlapping clock signals;
a first inverter having an input terminal configured to receive the first intermediate clock signal, and an output terminal for outputting the second clock signal;
a first delay circuit having an input terminal coupled to the output terminal of the first inverter, and an output terminal;
a second inverter having an input terminal coupled to the output terminal of the first delay circuit, and an output terminal for outputting the first clock signal;
a third inverter having an input terminal configured to receive the second intermediate clock signal, and an output terminal for outputting the fourth clock signal;
a second delay circuit having an input terminal coupled to the output terminal of the third inverter, and an output terminal; and
a fourth inverter having an input terminal coupled to the output terminal of the second delay circuit, and an output terminal for outputting the third clock signal.

12. The charge pump circuit of claim 8, wherein the ith charge pump unit further comprises:
a fourth N-type transistor having a first terminal coupled to the first terminal of the first N-type transistor of the ith charge pump unit, a second terminal coupled to a body terminal of the first N-type transistor of the ith charge pump unit, a control terminal coupled to the second terminal of the first N-type transistor of the ith charge pump unit, and a body terminal coupled to the body terminal of the first N-type transistor of the ith charge pump unit; and
a fifth N-type transistor having a first terminal coupled to the body terminal of the first N-type transistor of the ith charge pump unit, a second terminal coupled to the second terminal of the first N-type transistor of the ith charge pump unit, a control terminal coupled to the first terminal of the first N-type transistor of the ith charge pump unit, and a body terminal coupled to the body terminal of the first N-type transistor of the ith charge pump unit.

13. The charge pump circuit of claim 8, wherein the ith charge pump unit further comprises a discharge circuit coupled between the control terminal of the first N-type transistor of the ith charge pump unit and a system voltage terminal for receiving a system voltage.

14. The charge pump circuit of claim 13, wherein the discharge circuit comprises:
a sixth N-type transistor having a first terminal coupled to the control terminal of the first N-type transistor of the ith charge pump unit, a second terminal, and a control terminal configured to receive a bias voltage; and
a seventh N-type transistor having a first terminal coupled to the second terminal of the sixth N-type transistor of the ith charge pump unit, a second terminal coupled to the system voltage terminal, a control terminal configured to receive a control signal, and a body terminal coupled to the second terminal of the seventh N-type transistor of the ith charge pump unit.

15. The charge pump circuit of claim 14, wherein the sixth N-type transistor of the ith charge pump unit is an N-type laterally diffused metal oxide semiconductor (LDMOS).

16. The charge pump circuit of claim 8, wherein the (i+1)th charge pump unit further comprises:
a fourth N-type transistor having a first terminal coupled to the first terminal of the first N-type transistor of the (i+1)th charge pump unit, a second terminal coupled to a body terminal of the first N-type transistor of the (i+1)th charge pump unit, a control terminal coupled to the second terminal of the first N-type transistor of the (i+1)th charge pump unit, and a body terminal coupled to the body terminal of the first N-type transistor of the (i+1)th charge pump unit; and
a fifth N-type transistor having a first terminal coupled to the body terminal of the first N-type transistor of the (i+1)th charge pump unit, a second terminal coupled to the second terminal of the first N-type transistor of the (i+1)th charge pump unit, a control terminal coupled to the first terminal of the first N-type transistor of the (i+1)th charge pump unit, and a body terminal coupled to the body terminal of the first N-type transistor of the (i+1)th charge pump unit.

17. The charge pump circuit of claim 8, wherein the (i+1)th charge pump unit further comprises a discharge circuit coupled between the control terminal of the first N-type transistor of the (i+1)th charge pump unit and a system voltage terminal for receiving a system voltage.

18. The charge pump circuit of claim 17, wherein the discharge circuit comprises:
a sixth N-type transistor having a first terminal coupled to the control terminal of the first N-type transistor of the (i+1)th charge pump unit, a second terminal, and a control terminal configured to receive a bias voltage; and
a seventh N-type transistor having a first terminal coupled to the second terminal of the sixth N-type transistor of the (i+1)th charge pump unit, a second terminal coupled to the system voltage terminal, a control terminal configured to receive a control signal, and a body terminal coupled to the second terminal of the seventh N-type transistor of the (i+1)th charge pump unit.

19. The charge pump circuit of claim 18, wherein the sixth N-type transistor of the (i+1)th charge pump unit is an N-type laterally diffused metal oxide semiconductor (LDMOS).

20. The charge pump circuit of claim 8, wherein the second capacitor and the third capacitor of the ith charge pump unit and the second capacitor and the third capacitor of the (i+1)th charge pump unit are metal-oxide-metal (MOM) capacitors.

* * * * *